United States Patent

[11] 3,629,722

[72] Inventor Eugene C. Walding
Arlington Heights, Ill.

[21] Appl. No. 12,599
[22] Filed Feb. 19, 1970
[45] Patented Dec. 21, 1971
[73] Assignee Oak Electro/Netics Corporation
Crystal Lake, Ill.

[54] BACK-TO-BACK OSCILLATOR SWITCHING ARRANGEMENT
8 Claims, 3 Drawing Figs.

[52] U.S. Cl. 331/48, 331/49, 331/117 R, 331/179, 334/49, 334/56
[51] Int. Cl. H03b 5/12, H03j 5/28
[50] Field of Search 331/48, 49, 117 R, 179; 334/47, 49, 56; 74/10.1, 10.15, 10.2, 10.41

[56] References Cited

UNITED STATES PATENTS 2,802,946 8/1957 Feigl 334/49
2,905,814 9/1959 Huebscher 331/179 X
3,226,663 12/1965 Eland et al. 334/49
2,753,456 7/1956 Pan et al. 331/48
3,139,530 6/1964 Motte 331/46 X

*Primary Examiner*—Roy Lake
*Assistant Examiner*—Siegfried H. Grimm
*Attorney*—Parker, Carter and Markey

ABSTRACT: A switching arrangement including a rotatable shaft and a detent controlling position of the shaft. Mounted on the shaft are a pair of circuit element carriers, each including a plurality of similar circuit elements and having peripheral blades for use in making electrical connection with the circuit elements. Positioned alongside of the shaft are stationary clips, which are arranged relative to the shaft and the circuit element carriers such that at each position of the rotatable shaft, as controlled by the detent, only one circuit element will be connected to the stationary clips. Oscillator circuit means are associated with the stationary clips. At each position of the rotatable shaft only one circuit element is connected in operable electric circuit with the oscillator means.

INVENTOR.
Eugene C. Walding
BY Parker, Carter & Markey
Attorneys.

INVENTOR.
Eugene C. Walding
BY Parker, Carter & Markey
Attorneys.

BACK-TO-BACK OSCILLATOR SWITCHING ARRANGEMENT

SUMMARY OF THE INVENTION

This invention relates to a switching arrangement for connecting a plurality of coils to either one of two oscillator circuits.

A primary purpose of the invention is a switching arrangement of the type described which is effective, upon sequential movement of a rotatable shaft, as controlled by a detent, to connect a plurality of coils, alternately, into a pair of oscillators, so that only one oscillator operates at any one time.

Another purpose is a switching arrangement of the type described in which one of a plurality of circuit elements are sequentially connected to stationary contact means.

Another purpose is an oscillator circuit including a pair of oscillators and a plurality of coils and switching means such that one of the coils is connected, at a time, to only one of the oscillator circuit.

Another purpose is an improved, compact and reliably operable switching means for use in connecting a plurality of coils into one of two oscillator circuits.

Another purpose is an improved mechanical switching arrangement for use in connection with television tuners.

Another purpose is a switching arrangement in which a detent controlled shaft can effectively double the number of possible positions of the shaft by the use of two circuit element carriers, arranged to alternately be connected to stationary switch contacts.

Other purposes will appear in the ensuing specification, drawings and claims.

BRIEF DESCRIPTION OF THE DRAWINGS

The invention is illustrated diagrammatically in the following drawings wherein.

DESCRIPTION OF THE PREFERRED EMBODIMENT

The present invention has found application in the television tuner field, although obviously it has substantially wider use. However, in the field of TV tuners, but the use of the switching mechanism shown, 26 different discrete frequencies may be supplied to a television tuner by rotation of a single shaft. Two oscillators are mounted in the switching arrangement shown, and there are two coil carriers, each containing 13 RF coils. Rotation of the switch shaft is effective to alternately connect the coils into one or the other of the two oscillators, with only one coil being connected to one oscillator at any one position of the shaft. Thus, two 13-coil carriers, arranged as disclosed herein, can provide 26 different output frequencies from two oscillators by rotation of a single shaft.

Figure 1:
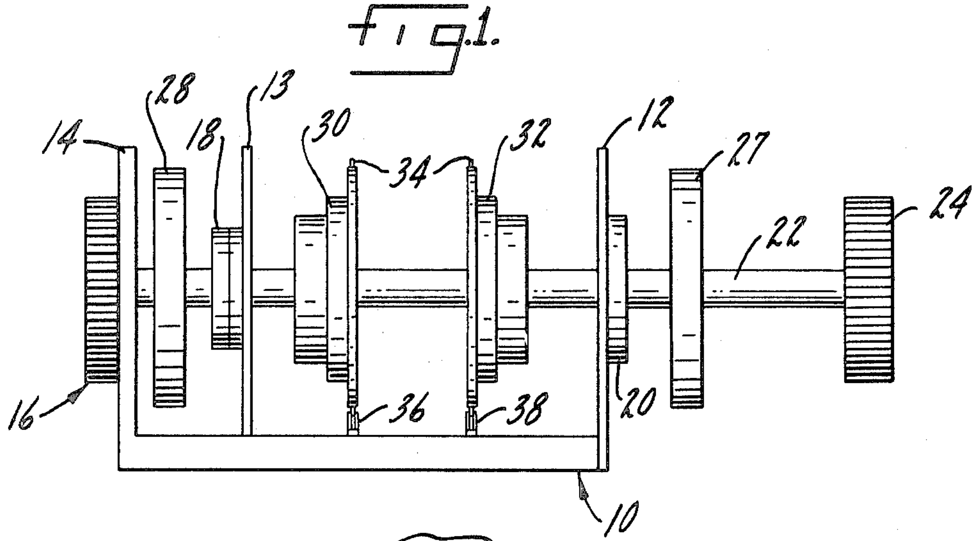
FIG. 1 is a diagrammatic side view of the switching mechanism disclosed herein.

In FIG. 1, a frame is indicated generally at 10 and may include end supports 12 and 14 and an intermediate support 13. Mounted on the rear end support 14 is a detent mechanism indicated generally at 16 and which, in the particular use disclosed herein, namely television tuners, may have 26 different fixed positions. Bearings 18 and 20 may support rotatable shaft 22 for movement in the frame 10. The detent 16 controls the position of the shaft 22. An operating handle 24 may be conveniently attached to the front end of the shaft. Tuning wheels 27 and 28 surround the shaft 22 and are conventionally used for fine tuning of the oscillator coils mounted in the two circuit element carriers. The relationship between the tuning wheels and the oscillator coils is well known in the art and will not be described in detail herein.

A pair of coil carrying elements are indicated at 30 and 32. Each may contain 13 separate coils, and means for tuning the coils, although such means are not disclosed in detail. Extending outwardly from each of the coil carriers 30 and 32, are blades 34, illustrated in detail in FIG. 2. Positioned on the frame 10 and generally adjacent the coil carriers 30 and 32 are fixed contact clips 36 and 38, there being one set of contact clips 36 adjacent the coil carrier 30 and a second pair of contact clips 38 adjacent the coil carrier 32. The clips 36 and 38 are illustrated diagrammatically in FIG. 2.

Figure 2:
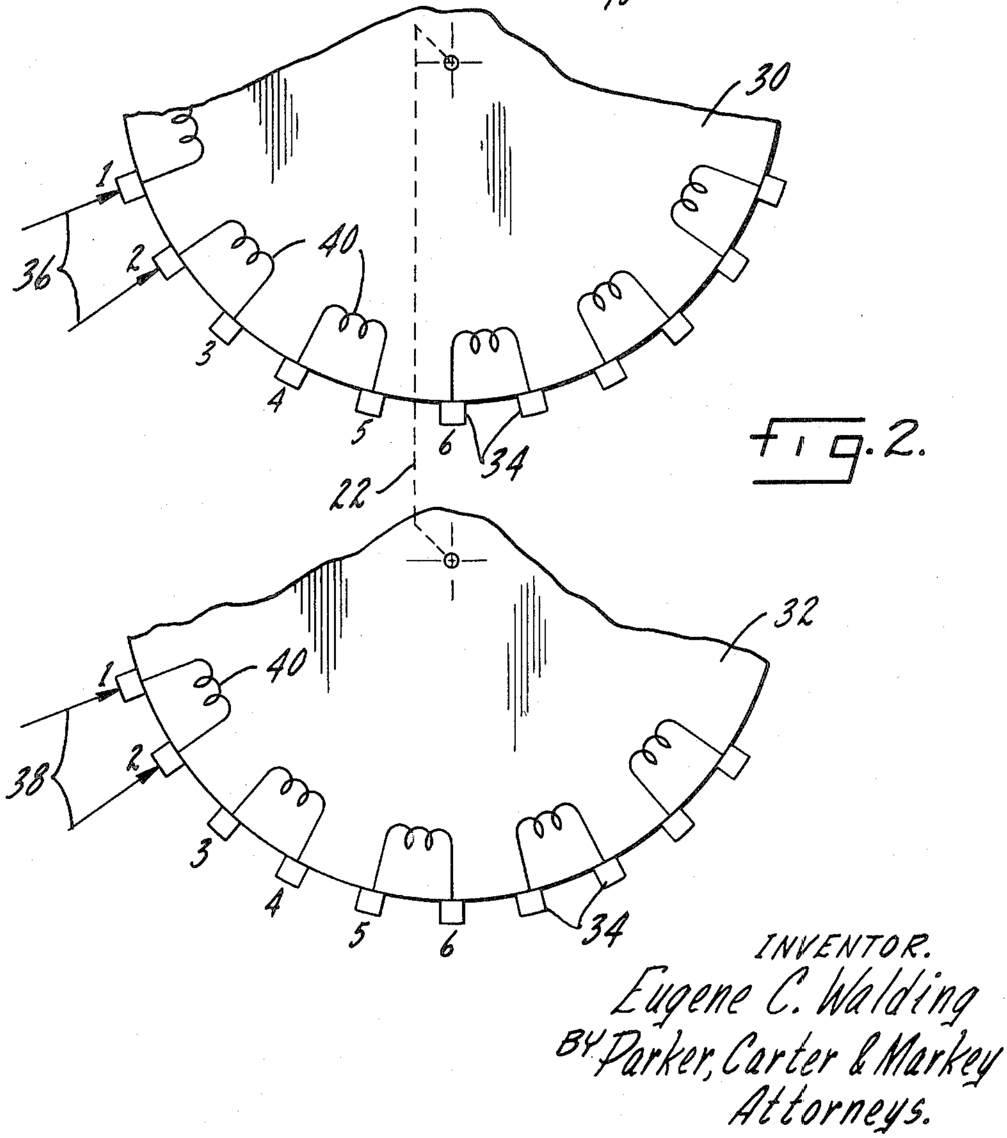
FIG. 2 is a diagrammatic illustration, with portions broken away, of the relationship between the fixed contacts and the movable circuit element carriers.

Illustrated particularly in FIG. 2 is the relationship between the blades 34, the clips 36 and 38, and the various coils 40. That portion of the two coil carriers 30 and 32 that are shown in FIG. 2 each have six blades which are numbered 1 through 6. In the coil carrier 30 there are coils connected between blades 2 and 3, and blades 4 and 5. In the coil carrier 32 there are coils connected between blades 1 and 2, 3 and 4, and 5 and 6. In one position of the rotatable shaft, which will be designated the first position, clips 36 are in contact with blades 1 and 2 and thus no coil will be connected across the clips. Clips 38 are also connected between blades 1 and 2, and a coil is connected between these two blades. In the second position of the shaft 22, the coil carriers have moved and clips 36 and 38 will be connected to blades 2 and 3. In this position, a coil 40 on the coil carrier 30 will be connected in circuit, but no coil from the coil carrier 32 will be connected. Thus, as the shaft 22 is rotated through its 26 discrete positions, coils from the carriers 30 and 32 will alternately be connected to one of the two pairs of clips 36 and 38. At no time will there be a coil from both coil carriers connected to both pairs of clips. Thus, by providing a detent which has a number of positions equal to the sum of the number of RF coils on the two coil carriers 30 and 32, it is possible to provide 26 different operating frequencies through rotation of the shaft 22.

Figure 3:
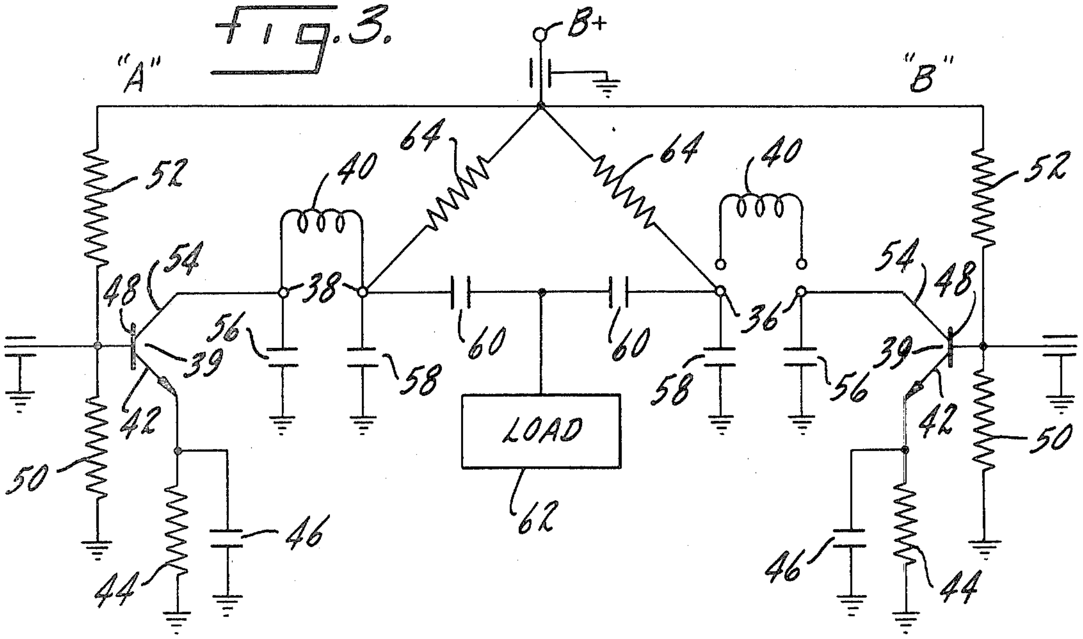
FIG. 3 is an electrical diagram of the oscillator circuits used in connection with the switching arrangement disclosed.

In FIG. 3, there are a pair of oscillator circuits designated oscillator A and oscillator B. Each circuit is identical and includes a transistor 39, which may be connected as a common base oscillator. The emitter 42 is connected through a biasing resistor 44 and a bypass capacitor 46 to ground. The base 48 of the transistor 39 is connected through a biasing resistor 50 to ground and is connected through a second biasing resistor 52 to B+. The collector 54 of transistor 39 is connected to a capacitor 56 and to one of the switch clips 38. A second capacitor 58 is connected to the other of the clips 38 and then through a coupling capacitor 60 to a load 62. A resistor 64 is connected between the right-hand clip 38 and B+. Coil 40 and capacitors 56 and 58 determine the oscillator frequency.

When a coil 40 is connected to clips 38, oscillator A will operate. Oscillator B will not operate as there is no coil in circuit. In the next position of the shaft 22 the coil will be removed from oscillator A and a different coil will be connected to oscillator B. The actual operation of the oscillator is conventional and need not be described in detail.

As indicated above, rotation of shaft 22 is effective to alternately connect a coil into either oscillator A or oscillator B. The coils can be sequentially connected, assuming the shaft continues to rotate in the same direction. Again, assuming the invention has application in the field of TV tuners, each of the coil carriers 30 and 32 may mount 13 coils so that there will be 26 discrete output frequencies provided at the load 62, by complete rotation of the shaft 22.

In an alternative arrangement there may be a single-oscillator circuit. In one position of shaft 22 a coil from carrier 30 would be connected in the oscillator circuit. In the next position of the shaft a coil from carrier 32 would be connected in the oscillator circuit. Continued shaft rotation would result in coils from the two carriers alternately being used in the single-oscillator circuit.

The particular switching arrangement shown has application in any circuit arrangement in which similar electrical elements are to be connected into circuit, alternately, by rotation of a single switching member. For example, in some circuit applications resistors or capacitors may comprise the circuit elements carried by either one or both of the carriers. In like manner, the invention should not be limited to only two circuit element carriers as there may be several circuit element carriers. Instead of having only one circuit element connected in circuit, if there are multiple carriers, all but one may have an element connected in circuit. The invention has a variety of applications.

Whereas the preferred form of the invention has been shown and described herein, it should be realized that there are many modifications, substitutions and alterations thereto within the scope of the following claims.

I claim:

1. In a mechanical switching arrangement, a rotatable shaft, a frame supporting said shaft for rotation, a multiposition detent attached to said shaft, at least two electrical circuit element carriers mounted for rotation with said shaft, each of said carriers including a plurality of circumferentially arranged similar electrical circuit elements, contact means rotatable with and connected to each circuit element, stationary contact means, adjacent each carrier, and positioned for electrical connection with said rotatable contact means, oscillator circuit means electrically connected in circuit with the stationary contact means, each stationary contact means being positioned relative to its adjacent carrier, such that at each position of the shaft, as controlled by said detent, a circuit element from only one carrier is electrically connected to the adjacent stationary contact means and operably connected in circuit with the oscillator circuit means.

2. The structure of claim 1 further characterized in that the total number of positions of said shaft, as controlled by said detent, is equal to the sum of the circuit elements on said carriers.

3. The structure of claim 1 further characterized in that said rotatable contact means are arranged about the periphery of each carrier and extend outwardly therefrom, said stationary contact means being mounted on said frame and positioned for mechanical contact with the rotatable contact means.

4. The structure of claim 1 further characterized in that said stationary contact means are positioned relative to the carriers so that the circuit elements on the carriers are alternatively connected to the stationary contact means.

5. In a mechanical switching arrangement, a rotatable shaft, a frame supporting said shaft for rotation, a multiposition detent attached to said shaft, at least two electrical circuit element carriers, each including a plurality of electrical coils, first electrical contact means on each carrier and connected to each coil, second electrical contact means adjacent each carrier, rotation of said shaft causing relative movement between said first and second electrical contact means, two electrical oscillator circuits, with each oscillator circuit being connected in circuit with said second electrical contact means, a circuit element carrier being associated with each oscillator circuit, said first and second electrical contact means being positioned relative to each other such that at each position of the shaft, as controlled by said detent, a coil from only one of said carriers is operably connected to said second electrical contact means and to one of said oscillator circuits.

6. The structure of claim 5 further characterized in that the total number of coil 2 on said carriers is equal to the number of positions of said shaft as controlled by said detent.

7. The structure of claim 5 further characterized in that each of said oscillator circuits includes a load and means providing an operating voltage for the oscillator, said coils providing the connection between the oscillator and the voltage for operating the oscillator such that when the coil is not in circuit, the oscillator will not operate.

8. In a double-oscillator circuit, a pair of oscillators, a common load, a plurality of coils, and switching means for alternately connecting a coil in circuit between the load and one of the oscillators, such connection placing the oscillator in an operative condition, an oscillator only being placed in an operative condition when a coil is connected between it and the load.

* * * * *